Nov. 21, 1967 P. AEMMER ETAL 3,354,402
CIRCUIT ARRANGEMENT FOR THE AMPLIFICATION OF A.C. VOLTAGES
Filed Oct. 8, 1963
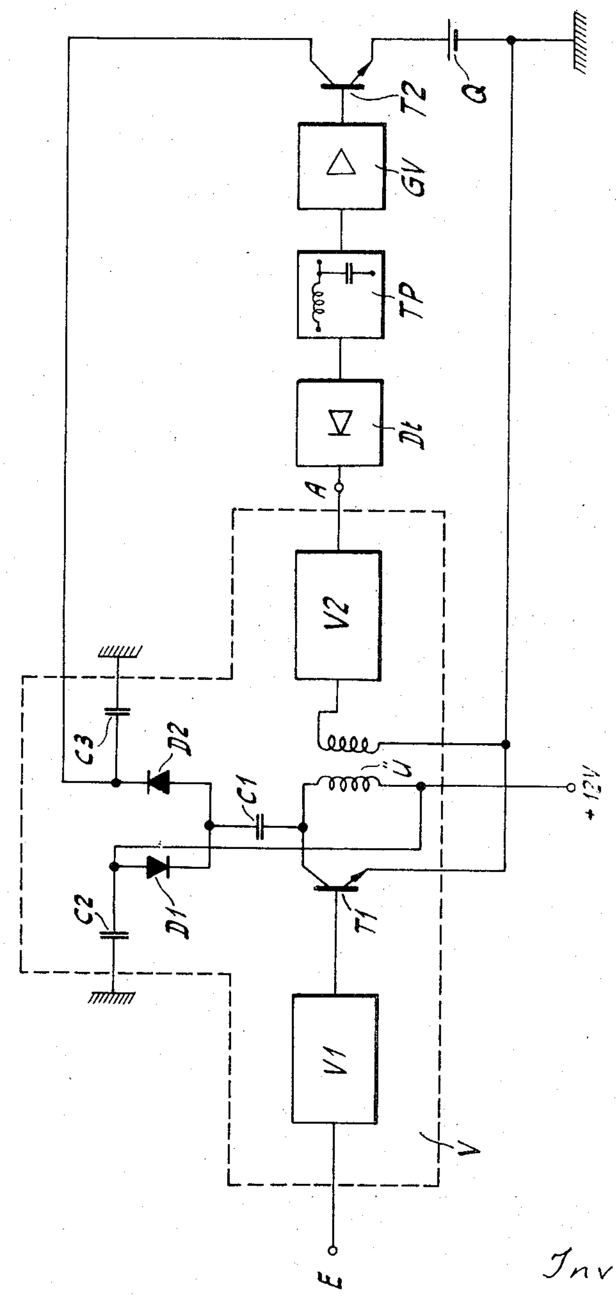
Inventors:
PETER AEMMER and
KARL SCHMUTZ
By: McGlew and Toren
Attorneys 3,354,402

CIRCUIT ARRANGEMENT FOR THE AMPLIFICATION OF A.C. VOLTAGES

Peter Aemmer and Karl Schmutz, Zurich, Switzerland, assignors to Albiswerk Zurich A.G., Zurich, Switzerland
Filed Oct. 8, 1963, Ser. No. 314,736
Claims priority, application Switzerland, Oct. 8, 1962, 11,800/62
4 Claims. (Cl. 330—24)

This invention relates to circuits for amplifying A.C. voltages which comprise one or more individual amplifiers, one of which has its gain, or amplification ratio, automatically controlled. More particularly, the present invention is directed to an improved A.C. voltage amplification circuit of this type in which the open loop gain of the gain control circuit at the amplifier output is maintained substantially constant irrespective of the controlling state of the control circuit.

Known circuits for amplifying A.C. voltages of the type mentioned above suffer from the disadvantage that the open loop gain is not maintained sufficiently constant. It is desirable that the open loop gain of the gain control circuit be constant, as constant loop gain is one presupposition for optimal controlling amplifiers, when they are required for quickly balancing fluctuations of the mean signal level but for not affecting slow modulation components carrying informations. Normally, the highest modulation frequency ($f1$) to be suppressed and the lowest modulation frequency ($f2$) carrying informations have only a small frequency difference. For the best gain control below $f1$, the loop gain must be high. Under the condition that $f1$ and $f2$ are very close, some distortions of the modulation frequency $f2$ by gain controlling is to be taken in account, and the loop again is to be small. Therefore, when choosing the loop gain, there must be a compromise. Departing from such compromise in one or the other sense results in deterioration. One chosen gain loop is therefore to be held constant, especially with reference to the controlling state of the control circuit.

An object of the present invention is to provide an automatically controlled A.C. voltage amplifier circuit in which this disadvantage is eliminated.

A further object of the invention is to provide an automatically controlled A.C. voltage amplifier in which open loop gain is constant.

Still a further object of the invention is to provide an automatically controlled A.C. voltage amplifier in which a D.C. voltage, proportional to the A.C. output voltage, is applied to control a transistor which, in turn, and through the medium of diode means, controls the attenuation in the amplifier circuit and which, also in turn, controls the amplification ratio or gain of the amplifier.

Thus, in accordance with the present invention, an A.C. voltage proportional to the A.C. output voltage of the amplifier is rectified in a detector to derive a unidirectional signal voltage which is proportional to the amplitude of the A.C. output voltage of the amplifier. The thus derived signal voltage is fed through a low pass filter to a D.C. voltage amplifier. The amplified unidirectional signal voltage is applied to the base of a transistor having biasing means connected in its emitter circuit and preset to a predetermined value. The collector or output current of this transistor is utilized to provide the gain control to the A.C. voltage amplifier. Thus, the collector or output current is applied to control one or more diodes which act as a variable attenuator in an A.C. circuit in which they are connected to influence the gain of the A.C. voltage amplifying circuit. These diodes operate in such a manner as to maintain the A.C. amplifier output voltage substantially independent of the mean amplitude of the input A.C. voltage to the amplifier.

For an understanding of the principles of the invention, reference is made to the following description of a typical embodiment thereof as illustrated in the accompanying drawing.

In the drawing, the single figure is a schematic wiring diagram of one embodiment of the invention.

The automatically controlled A.C. voltage amplifier circuit of the invention comprises only an A.C. voltage amplifier V and a gain control arrangement therefor which is responsive to the output voltage of the amplifier V to maintain the A.C. amplifier ouput voltage of amplifier V at a substantially constant value. Amplifier V is a cascaded amplifier including a first amplifier stage V1, an NPN transistor T1, a wide band transformer U and a second stage amplifier V2. The amplifier circuit also includes a pair of crystal diodes D1 and D2 connected in series with each other in the collector-emitter circuit of a second NPN transistor T2.

Through a condenser C1, the junction of diodes D1 and D2 is connected, in parallel opposition to each other, to the collector of transistor T1. A condenser C2 is connected between the anode terminal of diode D1 and ground, and a condenser C3 is connected between the cathode terminal of diode D2 and ground. The anode terminal of diode D1 is connected to the grounded positive terminal of a suitable source Q of direct current, and the cathode terminal of diode D2 is connected to the collector of transistor T2 included in the gain control circuit.

The gain control circuit includes a detector D*t* the output of which is applied, through a low pass filter TP, to the input of a D.C. amplifier GV. The base of NPN transistor T2 is connected to the output of D.C. amplifier GV. The input of detector D*t* is connected to the output of second stage amplifier V2 so that an A.C. voltage, which is proportional to the output voltages of amplifier V2, is applied to the input of detector D*t*. A preset initial emitter bias is applied to NPN transistor T2 from a grounded source of D.C. bias potential, by virtue of the emitter of transistor T2 being connected to the ungrounded negative terminal of bias voltage source Q. The emitter of NPN transistor T1 is also connected to ground.

One end of the primary winding of transformer U is connected to the positive pole of a twelve-volt D.C. voltage source, and the other end of the primary winding of transformer U is connected, in parallel with the collector of transistor T1, to the condenser C1, and thus to the junction point of the series connected diodes D1 and D2. One terminal of the secondary winding of transformer U is connected to ground, and the other terminal thereof is connected to the input of second stage amplifier V2. The output of amplifier V2 is connected to the terminal A to which is also connected the input of detector D*t*.

An A.C. voltage, such as, for example, a modulated high frequency voltage, is applied to the input E of A.C. voltage amplifier V. The amplified output voltage at the output terminal A is tapped by detector D*t* to derive a unidirectional signal voltage which is proportional to the amplitude of the A.C. output voltage. Through low pass filter TP, the thus derived unidirectional signal voltage is applied to the input of D.C. voltage amplifier GV. The thus amplified unidirectional signal voltage is applied to the base of transistor T2 which, as stated, has a source of D.C. bias connected in its emitter collector circuit.

The collector or output current of transistor T2 controls the diodes D1 and D2. These diodes are also connected in the A.C. amplifier circuit through condensers C1, C2 and C3. The diodes D1 and D2 function, in the A.C. circuit, in the manner of a variable attenuator. This variable attenuator controls the gain of amplifier V in such a manner that the A.C. output voltage is held at a substantially constant value. Furthermore, the open loop gain of the gain control circuit is constant, irrespective of the mean amplitude of the input A.C. voltage applied to terminal E.

A control circuit providing a constant open loop gain of the gain control circuit must satisfy the differential equation $$\frac{dv}{v}=-c\cdot dU \quad (1)$$

This equation expresses the fact that a small change of the output voltage always causes the same relative change of gain $dv/v$. By integration, the control equation $$v=v_0\cdot e^{-c\cdot U} \quad (2)$$

is derived. In Equation 2, $v_0$ and $c$ are constants.

The relation between voltage and current in the base-emitter circuit of transistor T2 satisfies the exponential equation $$i=i_0\cdot e^{\frac{U}{U_0}} \quad (3)$$

wherein $i_0$ and $U_0$ are constants. Thus, the collector current for transistor T2 may be derived approximately by the following equation:

$$i_c=\alpha'\cdot i_0\cdot e^{\frac{U}{U_0}} \quad (4)$$

In Equation 4, $\alpha'$ is the current amplification factor of transistor T2.

Transformer U is loaded by the input impedance of second stage amplifier V2 and by the collector resistance of transistor T1. If the circuit constants are so selected that the incremental resistance of control diodes D1 and D2 is much smaller than the parallel impedance of transformer U, then the relation between the control current $i$ and the gain of the amplifiers will satisfy the following equation:

$$v=v_1\cdot\left(\frac{i_1}{i}\right)^k \quad (5)$$

In Equation 5, $v_1$, $i_1$ and $k$ are constants. The predetermined condition of a high ohmic collector resistance of transistor T1 is satisfied with frequencies above 1 MHz. in a simple manner, if the transistor T1 has a tetrode construction.

The expression $$\left(\frac{i_1}{i}\right)^k$$

expresses the incremental forward resistance of a crystal diode which is traversed by a current which is a function of the control current $i$. According to Equations 4 and 5, the following applies:

$$v=v_1\cdot\left(\frac{i_1}{i_0\cdot\alpha'}\right)^k\cdot e^{-k\frac{U}{U_0}} \quad (6)$$

If the constants are such that $$v_1\cdot\left(\frac{i_1}{i_0\cdot\alpha'}\right)^k=v_0 \text{ and } \frac{k}{U_0}=C \quad (7)$$

then the Equation 6 corresponds exactly to the control Equation 2 necessary to be satisfied for constant open loop gain.

Transistor T2 becomes conductive as soon as the D.C. voltage applied to its base from unidirectional amplifier GV exceeds the predetermined bias voltage supplied by the biasing means in the emitter circuit of transistor T2. When transistor T2 becomes conductive, then the base-emitter circuit of the transistor acts to permit the flow of current.

In order to increase the control action, the A.C. voltage amplification can be effected in several stages of the A.C. voltage amplifier. Furthermore, the control current of the automatically controlled amplifier can also be used to control additional amplifiers in the unit and which are situated in other channels of a transmission arrangement, in such a manner that the amplification ratio or gain of the additional amplifiers is about proportional to the amplification ratio or gain of the automatically controlled amplifier.

While a specific embodiment of the invention has been shown and described in detail to illustrate the application of the principles of the invention, it will be understood that the invention may be embodied otherwise without departing from such principles.

What is claimed is:

1. An A.C. amplifier arrangement including a multi-stage, automatically controlled, A.C. potential amplifier means having transformer means coupling successive stages; means applying amplitude modulated A.C. input signals to the input of the amplifier arrangement; detector means connected to the output of the amplifier arrangement and generating a pulsating unidirectional voltage having a level proportional to the A.C. potential produced by the amplifier arrangement; a low-pass filter connected to the output of the detector means; D.C. amplifier means connected to the output of the filter; a transistor having a base, an emitter and a collector, the D.C. amplifier output being connected directly to the base of the transistor; a collector-emitter circuit including, in series, a D.C. source, a pair of diodes having respective first terminals of opposite polarity interconnected at a common junction point, the transistor collector and the transistor emitter; a first capacitor coupling a winding of the transformer means to the common junction point of the diodes; and second capacitors connecting the other terminals of the diodes to ground whereby the diodes act as controlled damping elements of said A.C. potential amplifier means: the improvement comprising said D.C. amplifier having low ohmic output; and a low ohmic source of bias potential having one terminal connected to the emitter of said transistor and the opposite terminal connected to ground; whereby the collector current of said transistor controls the A.C. amplification of said controlled A.C. potential amplifier means by controlling the operating point, and thus the incremental resistance, of said diodes.

2. In an A.C. amplifier arrangement, the improvement claimed in claim 1, in which said A.C. potential amplifier means includes a second transistor and a coupling transformer having its primary winding comprising said winding connected through said capacitor to said common junction point of said diodes; the secondary winding of said transformer being connected to the emitter of said second transistor; the collector of said second transistor being connected, in series with the primary winding of said transformer, to said source of D.C. potential; the base of said second transistor being connected to the output of a preceding stage of said A.C. potential amplifier means.

3. In an A.C. amplifier arrangement, the improvement claimed in claim 1, in which said diodes are crystal diodes.

4. In an A.C. amplifier arrangement, the improvement as claimed in claim 2, in which the incremental resistance of said diodes is substantially smaller than the parallel impedance of said transformer.

References Cited

UNITED STATES PATENTS

| | | | |
|---|---|---|---|
| 3,098,199 | 7/1963 | Carney et al. | 330—29 |
| 3,210,680 | 10/1965 | Farris | 330—29 X |
| 3,226,653 | 12/1965 | Miller | 330—29 X |

ROY LAKE, *Primary Examiner.*

NATHAN KAUFMAN, *Examiner.*